(12) United States Patent
Huemoeller et al.

(10) Patent No.: US 6,930,256 B1
(45) Date of Patent: Aug. 16, 2005

(54) INTEGRATED CIRCUIT SUBSTRATE HAVING LASER-EMBEDDED CONDUCTIVE PATTERNS AND METHOD THEREFOR

(75) Inventors: Ronald Patrick Huemoeller, Chandler, AZ (US); Sukianto Rusli, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 381 days.

(21) Appl. No.: 10/138,225

(22) Filed: May 1, 2002

(51) Int. Cl.[7] .............................................. H05K 1/16
(52) U.S. Cl. ...................... 174/260; 174/255; 174/262; 257/778
(58) Field of Search ................................ 174/260, 262, 174/264, 266, 265, 263, 261, 253, 255; 361/760, 361/767, 772, 777, 780, 783, 794, 795; 257/778, 257/782, 784

(56) References Cited

U.S. PATENT DOCUMENTS

| | | | |
|---|---|---|---|
| 4,322,778 A | | 3/1982 | Barbour et al. |
| 4,685,033 A | | 8/1987 | Inoue |
| 4,811,082 A | | 3/1989 | Jacobs et al. |
| 4,897,338 A | * | 1/1990 | Spicciati et al. ............ 430/314 |
| 5,021,047 A | | 6/1991 | Movern |
| 5,072,075 A | | 12/1991 | Lee et al. |
| 5,191,174 A | | 3/1993 | Chang et al. |
| 5,229,550 A | | 7/1993 | Bindra et al. |
| 5,239,448 A | | 8/1993 | Perkins et al. |
| 5,404,044 A | | 4/1995 | Booth et al. |
| 5,508,938 A | | 4/1996 | Wheeler |
| 5,531,020 A | * | 7/1996 | Durand et al. ................. 29/840 |
| 5,739,588 A | * | 4/1998 | Ishida et al. ................. 257/782 |
| 5,774,340 A | | 6/1998 | Chang et al. |
| 6,081,036 A | | 6/2000 | Hirano et al. |
| 6,239,485 B1 | | 5/2001 | Peters et al. |
| 6,316,285 B1 | * | 11/2001 | Jiang et al. .................. 438/106 |
| 6,365,975 B1 | | 4/2002 | DiStefano et al. |
| 6,407,341 B1 | * | 6/2002 | Anstrom et al. ............. 174/255 |
| 6,451,509 B2 | * | 9/2002 | Keesler et al. ............... 430/311 |
| 6,497,943 B1 | * | 12/2002 | Jimarez et al. .............. 428/209 |
| 6,544,638 B2 | * | 4/2003 | Fischer et al. ........... 428/322.7 |
| 6,730,857 B2 | * | 5/2004 | Konrad et al. ............... 174/257 |
| 6,753,612 B2 | * | 6/2004 | Adae-Amoakoh et al. .. 257/774 |
| 6,815,709 B2 | | 11/2004 | Clothier et al. |

* cited by examiner

OTHER PUBLICATIONS

NN9311589, IBM, Nov. 1, 1993.

*Primary Examiner*—Randy Gibson
*Assistant Examiner*—Ishwar (I. B.) Patel
(74) *Attorney, Agent, or Firm*—Weiss, Moy & Harris, P.C.

(57) ABSTRACT

An integrated circuit substrate having laser-embedded conductive patterns provides a high-density mounting and interconnect structure for integrated circuits. Conductive patterns within channels on the substrate provide interconnects that are isolated by the channel sides. A dielectric material is injection-molded or laminated over a metal layer that is punched or etched. The metal layer can provide one or more power planes within the substrate. A laser is used to ablate channels on the surfaces of the outer dielectric layer for the conductive patterns. The conductive patterns are electroplated or paste screen-printed and an etchant-resistive material is applied. Finally, a plating material can be added to exposed surfaces of the conductive patterns. An integrated circuit die and external terminals can then be attached to the substrate, providing an integrated circuit having a high-density interconnect.

22 Claims, 4 Drawing Sheets in the form of edge terminations along the top and/or bottom surface. The above-incorporated U.S. Patent Application discloses techniques for creating a substrate with embedded conductive patterns using embossing. The techniques of the present invention may be used along with the techniques of the above-incorporated patent application to create a substrate having embedded conductive patterns at a low cost.

INTEGRATED CIRCUIT SUBSTRATE HAVING LASER-EMBEDDED CONDUCTIVE PATTERNS AND METHOD THEREFOR

CROSS-REFERENCE TO RELATED APPLICATIONS

The present application is related to U.S. patent application Ser. No. 09/931,144 filed Aug. 16$^{th}$, 2001 by the same inventors and assigned to the same assignee. The specification of the above-referenced patent is herein incorporated by reference.

FIELD OF THE INVENTION

The present invention relates generally to semiconductor packaging, and more specifically, to a substrate having laser-embedded conductive patterns for providing electrical inter-connection within an integrated circuit package.

BACKGROUND OF THE INVENTION

Semiconductors and other electronic and opto-electronic assemblies are fabricated in groups on a wafer. Known as "dies", the individual devices are cut from the wafer and are then bonded to a carrier. The dies must be mechanically mounted and electrically connected to a circuit. For this purpose, many types of packaging have been developed, including "flip-chip", ball grid array and leaded grid array among other mounting configurations. These configurations typically use a planar printed circuit etched on the substrate with bonding pads and the connections to the die are made by either wire bonding or direct solder connection to the die.

The resolution of the printed circuit is often the limiting factor controlling interconnect density. Photo-etch and other processes for developing a printed circuit on a substrate have resolution limitations and associated cost limitations that set the level of interconnect density at a level that is less than desirable for interfacing to present integrated circuit dies that may have hundreds of external connections.

As the density of circuit traces interfacing an integrated circuit die are increased, the inter-conductor spacing must typically be decreased. However, reducing inter-conductor spacing has a disadvantage that migration and shorting may occur more frequently for lowered inter-conductor spacings, thus setting another practical limit on the interconnect density.

Therefore, it would be desirable to provide a method and substrate having improved interconnect density with a low associated manufacturing cost. It would further be desirable to provide a method and substrate having reduced susceptibility to shorting and migration between conductors.

SUMMARY OF THE INVENTION

A substrate having laser-embedded conductive patterns and a method for manufacturing generate a circuit pattern within a substrate having circuits embedded beneath the surface of the substrate. An outer dielectric layer is injection molded or laminated over a thin metal layer and channels outlining a desired circuit pattern are cut in the surface of the plastic layer using a laser. Conductive material is then plated or paste screened into the channels. The thin metal layer may be etched, mechanically drilled or punched to provide through holes for vias and to create separate power and ground paths within the metal layer. The process can be extended to multiple layers to create a sandwich structure for multilayer applications.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

The above-incorporated patent application discloses a process and structure for manufacturing a low-cost substrate having high conductor density and electrical integrity by embedding the conductive patterns beneath the surface of a substrate. The substrate is an embossed substrate requiring tooling to form channels for the conductive patterns. While embossing provides a low cost and high throughput manufacturing process for the substrate base, the tooling must be remanufactured when design changes are made, as it is unique to a particular design. For low volume applications such as prototyping, the cost to tool the embossing process may be prohibitive and in general, the techniques of the present invention will provide a lower cost alternative, except in designs or portions of designs that have large areas that are recessed such as wells for integrated circuit dies.

The present invention provides an alternative that does not require custom tooling for producing channels for conductors within a substrate and provides a manufacturing process, that in general, has fewer steps and lower overall cost in producing a substrate. For some embodiments of the present invention, a punching tool is required to make a metal frame, but for other embodiments of the present invention, the metal frame is etched or mechanically drilled and therefore no punching tool is required, reducing the cost of taking a particular design to the manufacturing process. As a result, the present invention provides a low cost alternative to the techniques of the above-incorporated patent application and an alternative with a greatly reduced startup or low-volume production cost. Also, the substrate material is not deformed to generate circuit channels in the techniques of the present invention, providing use of a wider range of materials for the dielectric layer and eliminates any reduction in the mechanical properties of the dielectric that are cause by deformation. A combination of the techniques described in the above-incorporated patent application and the techniques of the present invention may be used to emboss a large area, such as an integrated circuit die well, within the manufacturing process disclosed herein.

Figure 1A:
FIG. 1A is a pictorial diagram depicting a cross sectional side view of a metal layer for forming a substrate in accordance with an embodiment of the invention.
Figure 1B:
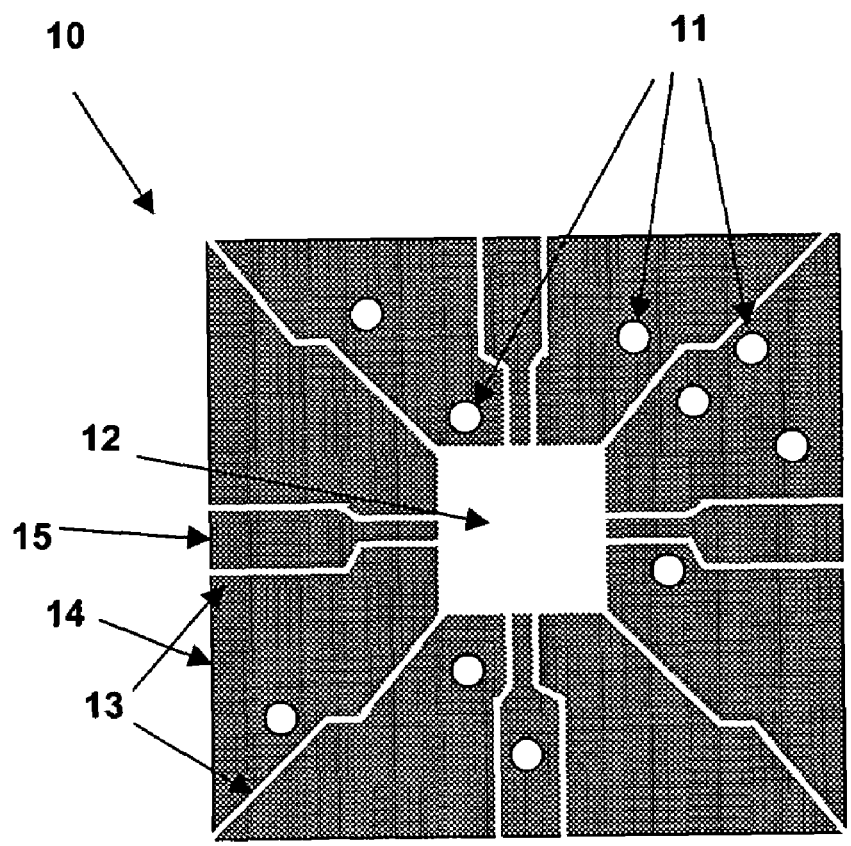
FIG. 1B is a pictorial diagram depicting a top view of a metal layer for forming a substrate in accordance with an embodiment of the invention.

Referring now to the figures and in particular to FIG. 1A, a side view of a metal layer 10 for use in preparing a substrate in accordance with an embodiment of the present invention is depicted. Metal layer 10 is used to form a substrate in a novel process that permits embedding circuits beneath the top and/or bottom surface of a substrate and isolating the circuits in channels. Metal layer 10 is generally a copper core that may be etched or die-cut, but other suitable metal layers may be used for form the core of the substrate of the present invention, such as a copper-INVAR-copper laminate. The ratio of copper to Invar can be varied to provide adjustment of the coefficient of thermal expansion (CTE) of the substrate. Holes 11 are generated in metal layer 10 to permit the passage of circuit paths through metal layer 10, while avoiding electrical contact with metal layer 10. Referring now to FIG. 1B, a top view of metal layer 10 is shown. A die aperture 12, for mounting an integrated circuit die is provided in the central area of metal layer 10. Isolating cuts 13 separate metal layer 10 into multiple conductive planes, such as power plane 15 and ground plane 14. A frame (not shown) can be provided around the periphery of metal layer 10 to hold the isolated planes in place until after the manufacture of the substrate.

Figure 2A:
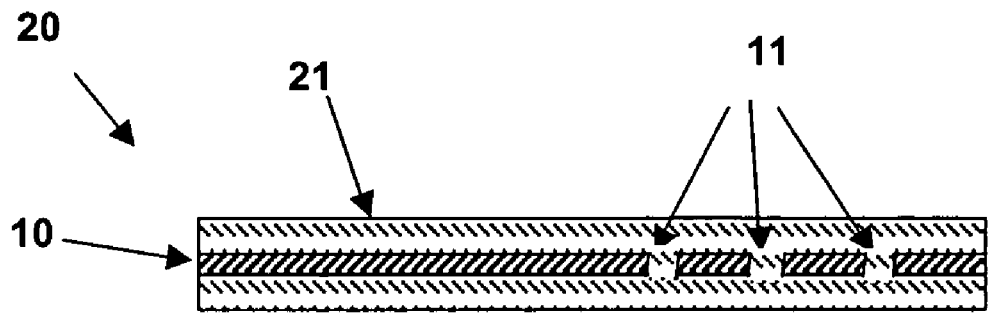
FIGS. 2A–2D are pictorial diagrams depicting cross-sectional side views of various stages of preparation of a substrate in accordance with an embodiment of the invention.

Referring now to FIG. 2A, the first stage in the preparation of a substrate 20 in accordance with an embodiment of the present invention is depicted. A dielectric outer layer 21 has been added to the top and bottom surface of metal layer 10 and can be provided by injection molding a plastic material around metal layer 10 or by laminating a dielectric such as KAPTON film or PTFE on each side of metal layer 10.

Figure 2B:
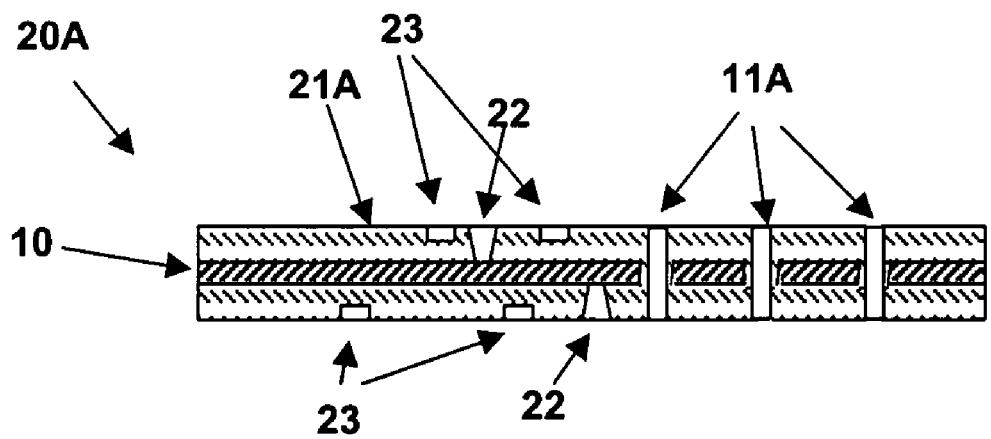

Referring now to FIG. 2B, the next stage in the preparation of substrate 20 is depicted. Substrate 20 is laser-ablated to form substrate 20A having an outer dielectric layer 21A as shown. Substrate 20A includes channels on both surfaces of the dielectric layer defining channels 23 for conductive paths, blind vias 22 for connection to ground and power planes formed in metal layer 10 and through vias 11A having a diameter smaller than holes 11 in metal layer 10, providing an insulating layer around holes 11. Blind vias 22 show a conical shape, which is preferred for addition of conductive material and can be generated by varying the laser angle or beam diameter as the dielectric material 21 is ablated.

Figure 2C:
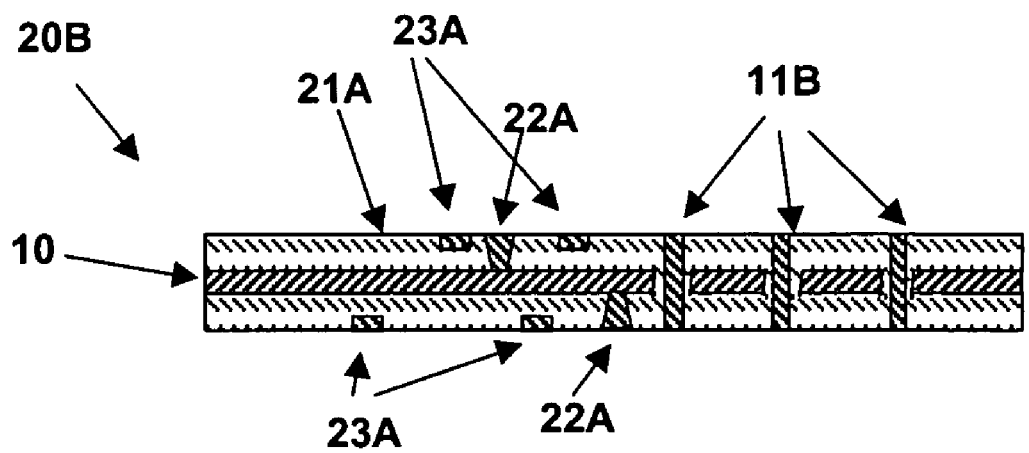
Figure 2D:
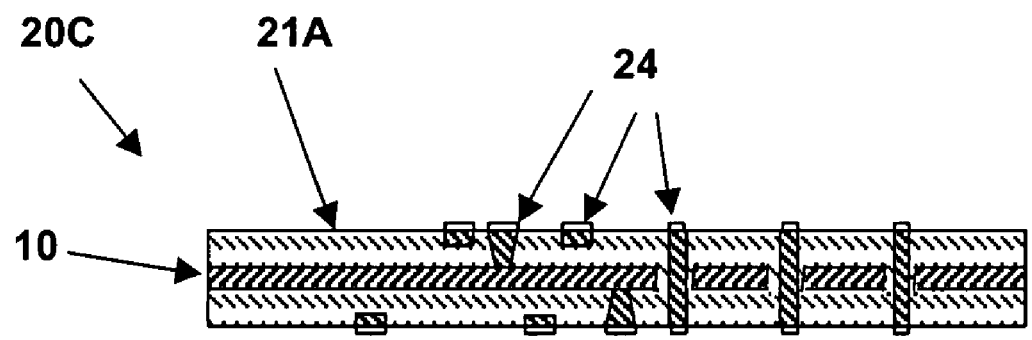

Next, referring to FIG. 2C, the next step in the preparation of substrate 20B providing a substrate 20C having conductive circuit paths. Conductive material is added within channels 23, blind vias 22 and through vias 11A to provide conductive paths 23A conductive blind vias 22A and conductive through vias 11B. The conductive material may be a silver or copper paste that is screen printed into channels 23, blind vias 22 and through vias 11A, and planarized to remove conductive material on the surface of outer dielectric layer 21A after printing. Alternatively, an electroplating process (generally copper electroplate) can be used to add conductive material within channels 23, blind vias 22 and through vias 11A and a planarization process or chemical etching process can be used to remove excess conductive material on the surface of dielectric layer 21A.

Multiple conductive layers may be generated by repeating the steps above, adding a second outer dielectric layer to the top and/or bottom surface of substrate 20B to form a multi-layer circuit on one or both sides of substrate 20B. Further, embossing steps in accordance with the above-incorporated patent application may be used to generate large area recesses in one or both sides of outer dielectric layer 21A, such as die mounting recesses.

Finally, top plating 24 is electroplated on the conductive surfaces deposited within the channels of substrate 20B to form plated substrate 20C. Nickel-Gold is generally used to provide a barrier migration layer and to provide electrical contact for wire or chip bonding in subsequent manufacturing steps. In general, silver-nickel is an appropriate electroplating material and if a silver paste was used to form conductive channels 23A, electroplating may not be needed to provide solderable conductive connections, but may be added to eliminate oxidation.

While the figures illustrate conductive circuit channels, the figures are depicting only a portion of the total substrate. Hundreds of circuit channels 23 will generally be used in an integrated circuit design and may be oriented in any direction within the surface of substrate 20C. The present invention provides a process for forming circuits within channels in a substrate that are below the top surface of the substrate. This an improvement over the present state of the art similar to that provided by above-incorporated patent application in that the prior art generally provides only surface conductors. The channels formed by laser ablation place the conductors below the surface and the conductors are thereby insulated from adjacent conductors by the substrate. The use of laser ablation techniques further provides improvement over the techniques of the above-incorporated patent application.

Figure 3:
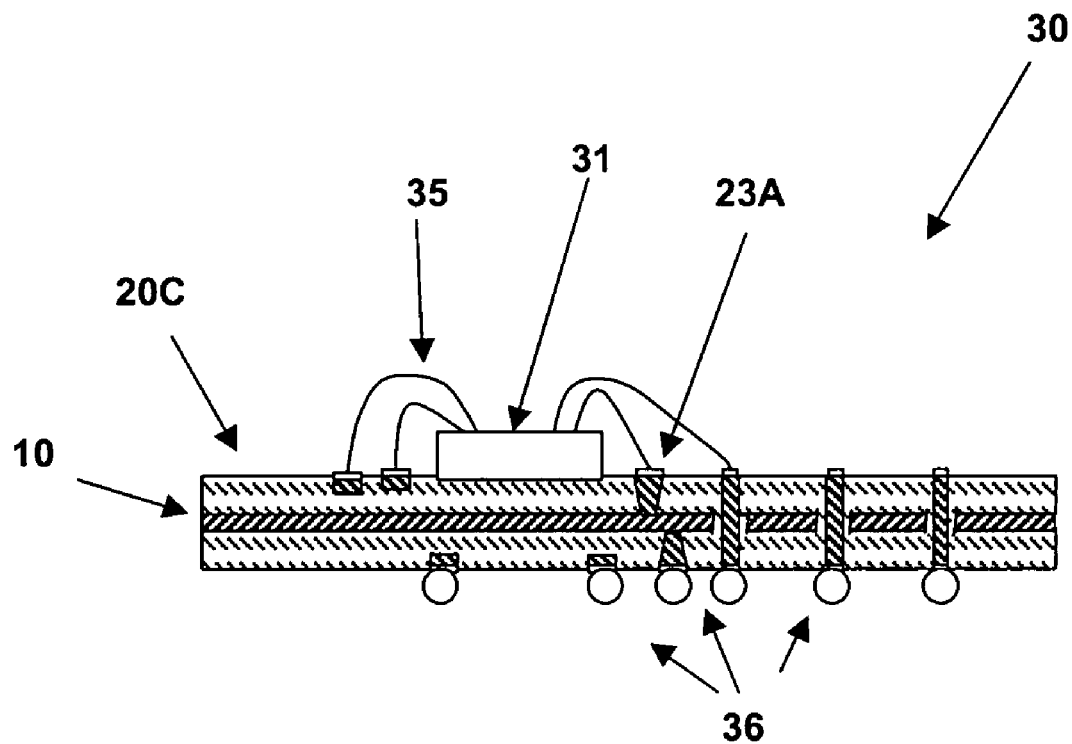
FIG. 3 is a pictorial diagram depicting an integrated circuit in accordance with an embodiment of the invention.

Referring now to FIG. 3, an integrated circuit 30 in accordance with an embodiment of the invention is depicted. A die 31 having electrical contacts is attached to substrate 20C and is electrically connected to conductive channels 23A by wires 35. Ball grid array (BGA) connections for the integrated circuit package are provided by solder balls 36 attached to the bottom channels 23A formed in substrate 20C.

The above description of embodiments of the invention is intended to be illustrative and not limiting. Other embodiments of this invention will be obvious to those skilled in the art in view of the above disclosure and fall within the scope of the present invention.

What is claimed is:

1. A substrate for a microelectronic circuit, comprising:
   an inner metal layer comprising one or more electrically continuous planes for providing one or more power supply connections;
   an outer dielectric layer comprising a homogeneous single sheet of dielectric material disposed on a top side of the inner metal layer and having laser-ablated top channels for addition of circuit material, the top channels having sides extending to a plane defining a top surface of the substrate and a bottom beneath the plane, wherein the bottom of the channels is located at a second plane substantially above the bottom surface of the outer dielectric layer; and
   circuit material deposited within the laser-ablated channels for forming electrical connections within the microelectronic circuit.

2. The substrate of claim 1, wherein the circuit material is an electroplated conductor deposited within the channels.

3. The substrate of claim 1, wherein the circuit material is paste-screened silver screened into the channels.

4. The substrate of claim 1, wherein the outer dielectric layer is an injection-molded plastic layer molded around the inner metal layer.

5. The substrate of claim 1, wherein the outer dielectric layer is a laminated layer formed by laminating sheets of dielectric material over the inner metal layer.

6. The substrate of claim 1, wherein the substrate further has bottom channels having sides extending to a bottom plane defining a bottom surface of the substrate and a top beneath the bottom plane, and wherein the circuit material is further deposited within the bottom channels.

7. The substrate of claim 6, wherein the inner metal layer defines voids for passage of vias, the outer dielectric layer includes voids in alignment with the voids in the inner metal layer and wherein the circuit material connects circuit material within top channels and circuit material within bottom channels through the voids in the outer dielectric layer and the inner metal layer.

8. The substrate of claim 7, wherein the voids in the outer dielectric layer voids have slanted walls providing a conical shape for promoting passage of the circuit material through the voids.

9. The substrate of claim 1, wherein the circuit material further forms wire bond pads for attaching wire-bond connections from a die mounted on the substrate.

10. The substrate of claim 1, further comprising a solderable plating layer deposited over the circuit material for preventing oxidation of the circuit material.

11. The substrate of claim 1, wherein the outer dielectric layer includes an embossed recess for component mounting.

12. An integrated circuit, comprising:
a substrate comprising
an inner metal layer comprising one or more electrically continuous planes for providing one or more power supply connections,
an outer dielectric layer comprising a homogeneous single sheet of dielectric material disposed on a top side of the inner metal layer and having laser-ablated top channels for addition of circuit material, the top channels having sides extending to a plane defining a top surface of the substrate and a bottom beneath the plane, wherein the bottom of the channels is located at a second plane substantially above the bottom surface of the outer dielectric layer, and
circuit material deposited within the laser-ablated channels for forming conductive paths within the microelectronic circuit;
a die mounted to the substrate and electrically coupled to the conductive paths; and
a plurality of electrical terminals mounted to the substrate and electrically coupled to the conductive paths for connecting the die to external circuits.

13. The integrated circuit of claim 12, wherein the circuit material is an electroplated conductor deposited within the channels.

14. The integrated circuit of claim 12, wherein the circuit material is paste-screened silver screened into the channels.

15. The integrated circuit of claim 12, wherein the outer dielectric layer is an injection-molded plastic layer molded around the inner metal layer.

16. The integrated circuit of claim 12, wherein the outer dielectric layer is a laminated layer formed by laminating sheets of dielectric material over the inner metal layer.

17. The integrated circuit of claim 12, wherein the substrate further has bottom channels having sides extending to a bottom plane defining a bottom surface of the substrate and a top beneath the bottom plane, and wherein the circuit material is further deposited within the bottom channels.

18. The integrated circuit of claim 17, wherein the inner metal layer defines voids for passage of vias, the outer dielectric layer includes voids in alignment with the voids in the inner metal layer and wherein the circuit material connects circuit material within top channels and circuit material within bottom channels through the voids in the outer dielectric layer and the inner metal layer.

19. The integrated circuit of claim 18, wherein the voids in the outer dielectric layer voids have slanted walls providing a conical shape for promoting passage of the circuit material through the voids.

20. The integrated circuit of claim 12, further comprising a solderable plating layer deposited over the circuit material for preventing oxidation of the circuit material.

21. The integrated circuit of claim 12, wherein the outer dielectric layer of the substrate includes an embossed recess for mounting the die.

22. An integrated circuit, comprising:
a die;
a plurality of electrical terminals for connecting the die to external circuits; and
a substrate dielectric layer comprising a homogeneous single sheet of dielectric material; and
means for providing electrical connections between the plurality of electrical terminals and electrical connections of the die, the connection providing means disposed within the dielectric material, terminating at a top side of the dielectric material and having a bottom located at a plane above a bottom surface of the dielectric material.

* * * * *